United States Patent [19]
Doan et al.

[11] Patent Number: 5,372,973
[45] Date of Patent: * Dec. 13, 1994

[54] METHOD TO FORM SELF-ALIGNED GATE STRUCTURES AROUND COLD CATHODE EMITTER TIPS USING CHEMICAL MECHANICAL POLISHING TECHNOLOGY

[75] Inventors: Trung T. Doan; J. Brett Rolfson; Tyler A. Lowrey; David A. Cathey, all of Boise, Id.

[73] Assignee: Micron Technology, Inc., Boise, Id.

[ * ] Notice: The portion of the term of this patent subsequent to Feb. 16, 2010 has been disclaimed.

[21] Appl. No.: 53,794

[22] Filed: Apr. 27, 1993

Related U.S. Application Data

[63] Continuation of Ser. No. 837,453, Feb. 14, 1992, Pat. No. 5,229,331.

[51] Int. Cl.$^5$ .......................... H01L 21/465
[52] U.S. Cl. .................... 437/228; 156/643
[58] Field of Search ............... 437/228, 225; 445/50, 445/49; 313/309; 156/643, 645

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 3,875,442 | 4/1975 | Wasa et al. | 313/193 |
| 3,921,022 | 11/1975 | Levine | 313/309 |
| 3,970,887 | 7/1976 | Smith et al. | 313/309 |
| 3,998,678 | 12/1976 | Fukase et al. | 156/3 |
| 4,666,553 | 5/1987 | Blumenfeld et al. | 156/643 |
| 4,671,851 | 6/1987 | Beyer et al. | 156/645 |
| 4,746,629 | 5/1988 | Hanagasaki | 437/162 |
| 4,857,799 | 8/1989 | Spindt et al. | 313/495 |
| 4,943,343 | 7/1990 | Bardai et al. | 156/643 |
| 4,964,946 | 10/1990 | Gray et al. | 156/643 |
| 5,036,015 | 7/1991 | Sandhu et al. | 437/8 |
| 5,055,158 | 10/1991 | Gallagher et al. | 156/643 |
| 5,070,282 | 12/1991 | Epsztein | 315/383 |
| 5,143,820 | 9/1992 | Kotecha et al. | 430/314 |
| 5,186,670 | 2/1993 | Doan et al. | 445/24 |
| 5,229,331 | 7/1993 | Doan et al. | 437/228 |
| 5,232,549 | 8/1993 | Catloy et al. | 456/633 |
| 5,259,799 | 11/1993 | Doan et al. | 445/24 |
| 5,266,530 | 11/1993 | Bagley et al. | 437/228 |

FOREIGN PATENT DOCUMENTS 56-160740 12/1981 Japan .................... 445/50

OTHER PUBLICATIONS

Sharp Corp. Tokyo Res. Labs. M. Urayama, Y. Maruo, Y. Akagi, T. Ise, "Fabrication of Cone-Like field Emitters", 19 a–ZM-6, p. 553, Extended Abstracts (The 53rd Autumn Meeting, 1992); The Japan Society of Applied Physics, No. 2.

*Primary Examiner*—George Fourson
*Assistant Examiner*—Richard A. Booth
*Attorney, Agent, or Firm*—Lia M. Pappas

[57] ABSTRACT

A chemical mechanical polishing process for the formation of self-aligned gate structures surrounding an electron emission tip for use in field emission displays in which the emission tip is i) optionally sharpened through oxidation, ii) deposited with a conformal insulating material, iii) deposited with a flowable insulating material, which is reflowed below the level of the tip, iv) optionally deposited with another insulating material, v) deposited with a conductive material layer, and vi) optionally, deposited with a buffering material, vii) planarized with a chemical mechanical planarization (CMP) step, to expose the conformal insulating layer, viii) wet etched to remove the insulating material and thereby expose the emission tip, afterwhich ix) the emitter tip may be coated with a material having a lower work function than silicon.

20 Claims, 5 Drawing Sheets

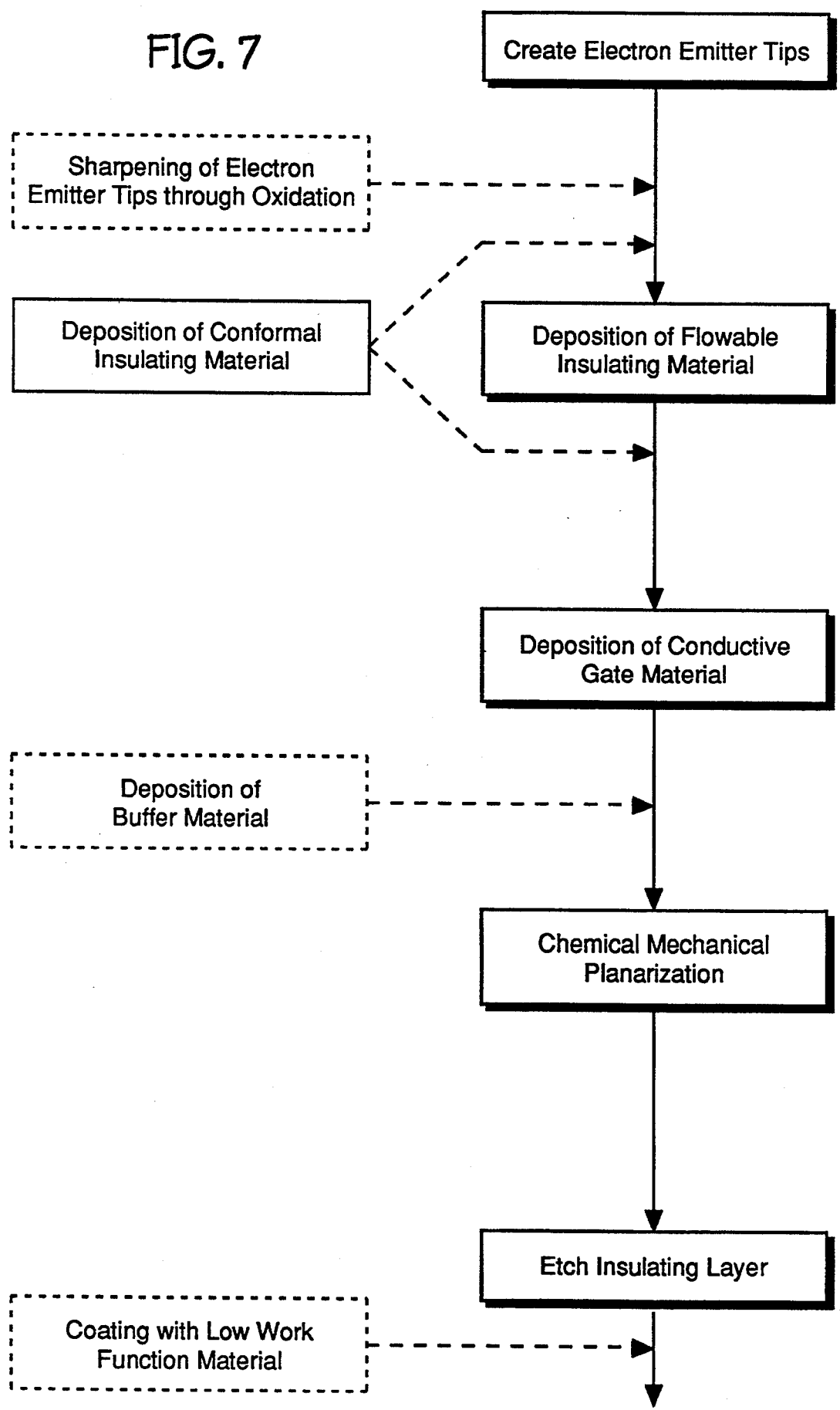

METHOD TO FORM SELF-ALIGNED GATE STRUCTURES AROUND COLD CATHODE EMITTER TIPS USING CHEMICAL MECHANICAL POLISHING TECHNOLOGY

This is a continuation of application Ser. No. 07/837,453, filed Feb. 14, 1992, now U.S. Pat. No. 5,229,331.

FIELD OF THE INVENTION

This invention relates to field emission devices, and more particularly to processes for creating gate structures which are self-aligned to the emitter tips using chemical mechanical planarization (CMP).

Background of the Invention

Cathode ray tube (CRT) displays, such as those commonly used in desk-top computer screens, function as a result of a scanning electron beam from an electron gun, impinging on phosphors on a relatively distant screen. The electrons increase the energy level of the phosphors. When the phosphors return to their normal energy level, they release the energy from the electrons as a photon of light, which is transmitted through the glass screen of the display to the viewer.

Flat panel displays have become increasingly important in appliances requiring lightweight portable screens. Currently, such screens use electroluminescent or liquid crystal technology. A promising technology is the use of a matrix-addressable array of cold cathode emission devices to excite phosphor on a screen.

In U.S. Pat. No. 3,875,442, entitled "Display Panel," Wasa et. al. disclose a display panel comprising a transparent gas-tight envelope, two main planar electrodes which are arranged within the gas-tight envelope parallel with each other, and a cathodeluminescent panel. One of the two main electrodes is a cold cathode, and the other is a low potential anode, gate, or grid. The cathode luminescent panel may consist of a transparent glass plate, a transparent electrode formed on the transparent glass plate, and a phosphor layer coated on the transparent electrode. The phosphor layer is made of, for example, zinc oxide which can be excited with low energy electrons. This structure is depicted in FIG. 1.

Spindt, et. al. discuss field emission cathode structures in U.S. Pat. Nos. 3,665,241, and 3,755,704, and 3,812,559. To produce the desired field emission, a potential source is provided with its positive terminal connected to the gate, or grid, and its negative terminal connected to the emitter electrode (cathode conductor substrate). The potential source may be made variable for the purpose of controlling the electron emission current. Upon application of a potential between the electrodes, an electric field is established between the emitter tips and the low potential anode grid, thus causing electrons to be emitted from the cathode tips through the holes in the grid electrode.

An array of points in registry with holes in low potential anode grids are adaptable to the production of cathodes subdivided into areas containing one or more tips from which areas emissions can be drawn separately by the application of the appropriate potentials thereto.

The clarity, or resolution, of a field emission display is a function of a number of factors, including emitter tip sharpness, alignment and spacing of the gates, or grid openings, which surround the tips, pixel sizer as well as cathode-to-gate and cathode-to-screen voltages. These factors are also interrelated. For example, the voltage required for electron emission from the emitter tips is a function of both cathode-to-gate spacing and tip sharpness. One advantage of the disclosed process is that very narrow cathode-to-gate spacing is possible, which permits the use of threshold voltages that are at least an order of magnitude lower than those previously reported. Since emitted current is proportional to the difference of the applied emitter-to-gate voltage and the emission threshold voltage, for any given emitter-to-gate voltage, a lowered threshold voltage will result in greater current.

The gate etch masks of early field emission displays were manually aligned to emitter tips. Manual alignment introduces variability into the process, which often results in less than optimum electron emission patterns. U.S. Pat. No. 3,970,887 entitled "Micro-Structure Field Emission Electron Source," teaches self-alignment of emitter tips. The self-aligned fabrication of emitter tips and gates greatly reduces process variability, decreases manufacturing costs, and results in a display having greater image sharpness.

Summary of the Invention

The object of the present invention is create an improved self-aligned process for fabricating field emission displays. The disclosed process utilizes multiple, selectively etchable dielectric layers in combination with chemical mechanical planarization to create ultrafine gate-to-tip spacing which results in emission threshold voltages that are at least an order of magnitude lower than those previously reported in the literature. Since emitted current is proportional to the difference of the applied emitter-to-gate voltage and the emission threshold voltage, for any given emitter-to-gate voltage, a lowered threshold voltage will result in greater current.

BRIEF DESCRIPTION OF THE DRAWINGS

The present invention will be better understood from reading the following description of nonlimitative embodiments, with reference to the attached drawings, wherein below:

FIG. 6A shows the result if the insulating layer is an oxide. FIG. 6B shows the result if the insulating layer is a nitride.

FIG. 7 is a flow diagram of the steps involved in a gate formation process in accordance with the present invention.

DESCRIPTION OF THE INVENTION

Figure 1:
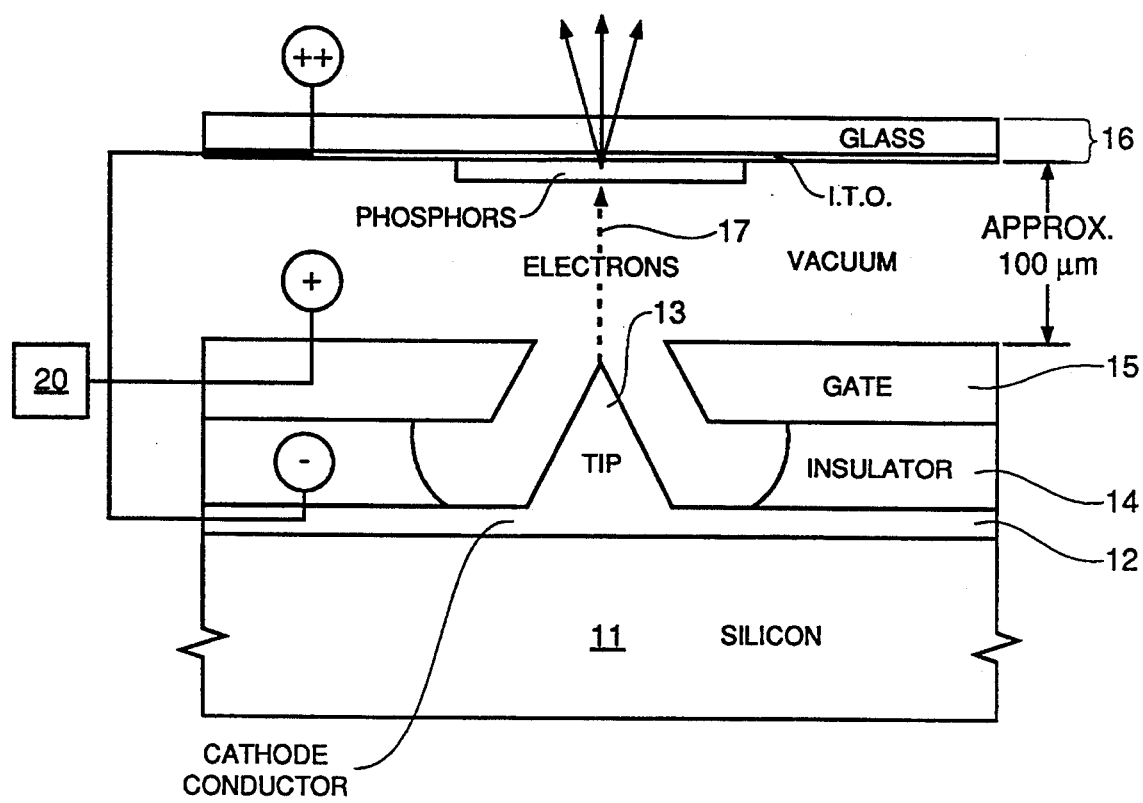
FIG. 1 is a cross-sectional schematic drawing of a fiat panel display showing an electron emission tip, or field emission cathode, surrounded by the self-aligned gate structures formed using the process of the present invention.

Referring to FIG. 1, a field emission display employing a cold cathode is depicted. The substrate 11 can be comprised of glass, for example, or any of a variety of other suitable materials. In the preferred embodiment, a single crystal silicon layer serves as a substrate 11 onto which a conductive material layer 12, such as doped polycrystalline silicon has been deposited. At a field emission site location, a conical micro-cathode 13 has been constructed on top of the substrate 11. Surrounding the micro-cathode 13, is a low potential anode gate structure 15. When a voltage differential, through source 20, is applied between the cathode 13 and the gate 15, a stream of electrons 17 is emitted toward a phosphor coated screen 16. Screen 16 is an anode. The electron emission tip 13 is integral with the single crystal semiconductor substrate 11, and serves as a cathode conductor. Gate 15 serves as a low potential anode or grid structure for its respective cathode 13. A dielectric insulating layer 14 is deposited on the conductive cathode layer 12. The insulator 14 also has an opening at the field emission site location.

The invention can best be understood with reference to FIGS. 2–7 of the drawings which depict the initial, intermediate and final structures produced by a series of manufacturing steps according to the invention.

There are several methods by which to form the electron emissions tips employed in the process of the present invention. Examples of such methods are presented in U.S. Pat. No. 3,970,887 entitled "Micro-structure Field Emission Electron Source."

In practice, a single crystal P-type silicon wafer having formed therein (by suitable known doping pretreatment) a series of elongated, parallel extending opposite N-type conductivity regions, or wells. Each N-type conductivity strip has a width of approximately 10 microns, and a depth of approximately 3 microns."The spacing of the strips is arbitrary and can be adjusted to accommodate a desired number of field emission cathode sites to be formed on a given size silicon wafer substrate. (Processing of the substrate to provide the P-type and N-type conductivity regions may be by may well-known semiconductor processing techniques, such as diffusion and/or epitaxial growth.) If desired the P-type and N-type regions, of course, can be reversed through the use of a suitable starting substrate and appropriate dopants.

The wells, having been implanted with ions will be the site of the emitter tips. A field emission cathode microstructure can be manufactured using an underlying single crystal, semiconductor substrate. The semiconductor substrate may be either P or N-type and is selectively masked on one of its surfaces where it is desired to form field emission cathode sites. The masking is done in a manner such that the masked areas define islands on the surface of the underlying semiconductor substrate. Thereafter, selective sidewise removal of the underlying peripheral surrounding regions of the semiconductor substrate beneath the edges of the masked island areas results in the production of a centrally disposed, raised, single crystal semiconductor field emitter tip in the region immediately under each masked island area defining a field emission cathode site. It is preferred that the removal of underlying peripheral surrounding regions of the semiconductor substrate be closely controlled by oxidation of the surface of the semiconductor substrate surrounding the masked island areas with the oxidation phase being conducted sufficiently long to produce sideways growth of the resulting oxide layer beneath the peripheral edges of the masked areas to an extent required to leave only a non-oxidized tip of underlying, single crystal substrate beneath the island mask. Thereafter, the oxide layer is differentially etched away at least in the regions immediately surrounding the masked island areas to result in the production of a centrally disposed, raised, single crystal semiconductor field emitter tip integral with the underlying single, crystal semiconductor substrate at each desired field emission cathode site.

Before beginning the gate formation process, the tip of the electron emitter may be sharpened through an oxidation process (FIG. 7). The surface of the silicon wafer (Si)11 and the emitter tip 13 are oxidized to produce an oxide layer of $SiO_2$, which is then etched to sharpen the tip. Any conventional, known oxidation process may be employed in forming the $SiO_2$, and etching the tip.

Figure 2:
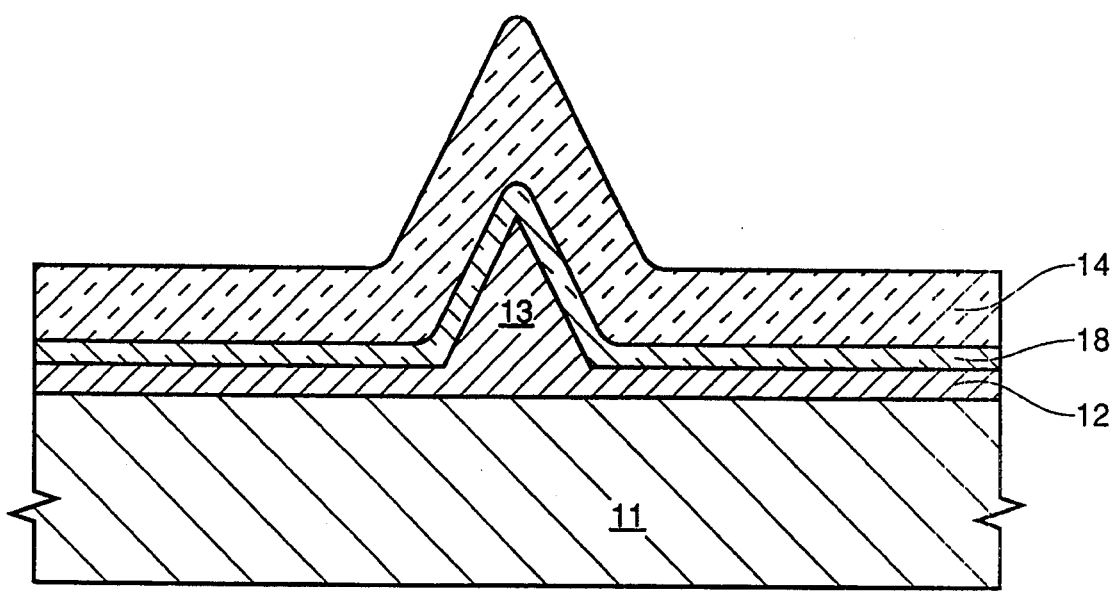
FIG. 2 shows an electron emitter tip having a conformal insulating layer and a flowable insulating layer deposited thereon, according to the present invention.

The next step (FIG. 7), a selectively etchable material layer is deposited. In the preferred embodiment process, a conformally deposited silicon nitride layer is used. Although other materials which are selectively etchable with respect to the flowable insulative layer may be used, (e.g., $SiO_2$, and silicon oxynitride) a nitride layer is particularly effective against oxygen diffusion and, therefore, can be used for layers as thin as 1000 Å, but preferably greater than 1000 Å. This is particularly advantageous, since small gate 15 to cathode 13 distances result in lower emitter drive voltages. The thickness of the insulating dielectric layer 18 will determine the gate 15 to cathode 13 spacing. The nitride insulating layer 18, as shown in FIG. 2, is a conformal insulating layer. The nitride layer is deposited on the emitter tip 13 in a manner such that the nitride layer conforms to the conical shape of the cathode emitter tip 13.

The next step (FIG. 7), is the deposition of the flowable insulating layer 14, as shown in FIG. 2. The flowable insulating layer 14 may be comprised of spin-on-glass (SOG), borophosphosilicate glass (BPSG), or a polyimide, or other suitable material, including, but not limited to, other spin on dielectrics or flowable dielectrics. Under certain conditions, such materials flow easily over the surface of the wafer, resulting in a densified planarized layer. The thickness of the flowable insulating layer 14, together with the conformal insulating layer 18 will determine the gate 15 to substrate 11 spacing; the conformal insulating layer 18 alone substantially determines the gate 15 to cathode 13 spacing.

The preferred embodiment uses BPSG. The BPSG layer may be initially deposited by a technique such as chemical vapor deposition (CVD) using a phosphorous source such as phosphine ($PH_3$) gas. The wafer surface may also be exposed to a boron source such as diborane ($B_2H_6$) gas. The resultant BPSG layer 14 initially, may cover the cathode tip 13, and it may then be reflowed. In general, the BPSG reflow is performed at a temperature in the range of 700° C. to 1050° C. In practice, the upper limit of the reflow temperature will be controlled by the effects of the reflow on the substrate and other related structures.

Figure 3:
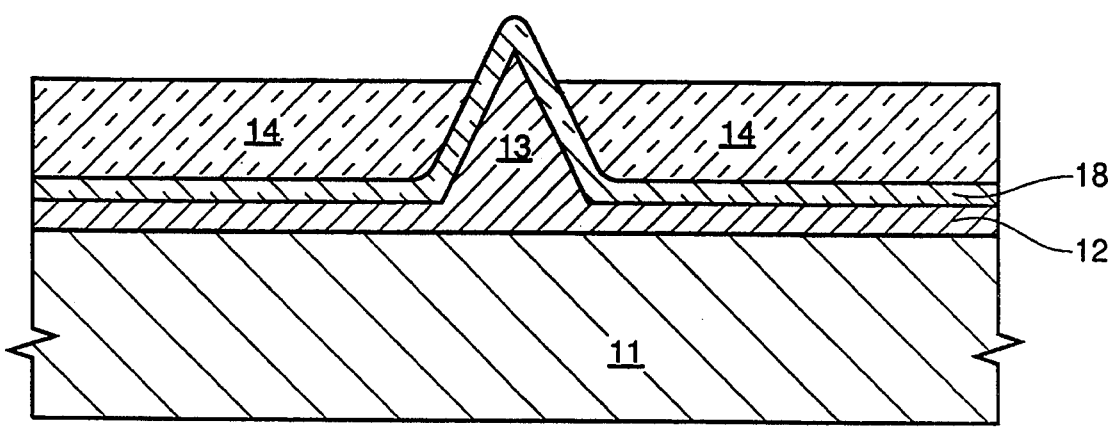
FIG. 3 shows the electron emitting tip of FIG. 2 following the reflow heating of the flowable insulating layer, at approximately 1000° C., according to the present invention.
Figure 4:
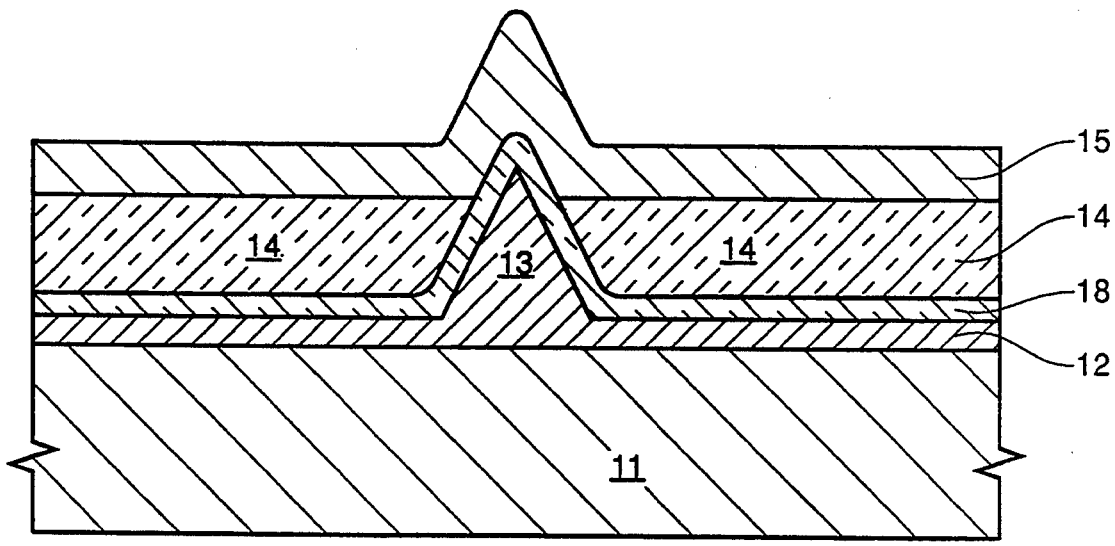
FIG. 4 shows the electron emitting tip of FIG. 3 after the conductive gate layer has been deposited thereon, according to the present invention.

In the preferred embodiment, the BPSG layer is heated to a temperature of approximately 1000° C. to cause a slight flow of the flowable insulating material, preferably, to a substantially uniform level below the emitter tip 13, as shown in FIG. 3.

A technique described in U.S. Pat. No. 4,732,658, describes the use of a CVD method. A silicate glass such a BPSG is deposited over a region of a semiconductor wafer as an approximately uniform thickness layer. The glass is deposited by CVD in an atmospheric system. A review of suitable atmospheric systems is given in W. Kern, G.L. Schnable, RCA Review, Vol. 43, pgs. 423–457, September 1982.

A variation of atmospheric CVD systems is given in W. Kern, G.L. Schnable, RCA Review, Vol. 43, pgs 423–457, September 1982, the same being incorporated herein called plasma-enhanced CVD (PECVD) could also be used to deposit the silicate glass. PECVD is more particularly described in "Process and Film Characterization of PECVD Borophosphosilicate Films for VLSI Applications" J.E. Tong, K. Schertenleib and R.A. Carpio, Solid State Technology, pgs. 161–170, January 1984. Other deposition processes, such as low pressure CVD, may also be used to deposit the silicate glass.

As shown in FIG. 7, another insulating nitride material layer may optionally be deposited at this stage on top of the flowable insulating material 14 to further adjust the spacing between the gate 15 and the tip 13.

In an alternative embodiment, deposition of the conformal insulating dielectric layer may be delayed until this stage in the gate forming process, i.e., after the deposition and reflow of the flowable insulating material layer 14. In other words, the flowable insulating layer 14 may be deposited first, followed by the deposition of the conformal insulating layer. After the reflow step, the emitter tip 13 would be exposed, thereby providing an opportunity to deposit a conformal insulating layer prior to the deposition of the conductive gate material layer 15.

The next step in the process (FIG. 7) is the deposition of the conductive gate material 15. The gate 15 is formed from a conductive layer. The conductive material Layer may comprise a metal such as chromium or molybdenum, but the preferred material for this process is deemed to be doped polysilicon.

At this stage in the fabrication, (FIG. 7) a buffer material may be deposited to prevent the undesired etching of the lower-lying portions of the conductive gate material layer during the chemical mechanical polishing (CMP) step which follows. It should be emphasized that the deposition of a buffering layer is an optional step. A suitable buffering material is a thin layer of $Si_3N_4$. The nitride buffer layer has the effect of protecting the tip 13, which is one advantage of performing this optional step. The buffering layer substantially impedes the progress of the CMP into the layer on which the buffering material is deposited.

The next step in the gate formation process (FIG. 7) is the chemical mechanical planarization (CMP), also referred to in the art as chemical mechanical polishing (CMP). Through the use of chemical and abrasive techniques, the buffer material as well as any other layers (e.g. the conductive material layer, the conformal insulating layer) extending beyond the emitter tip 13 are "polished" away.

In general, CMP involves holding or rotating a wafer of semiconductor material against a wetted polishing surface under controlled chemical slurry, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. Such apparatus for polishing are disclosed in U.S. Pat. Nos. 4,193,226 and 4,811,522. Another such apparatus is manufactured by Westech Engineering and is designated as a Model 372 Polisher.

CMP will be performed substantially over the entire wafer surface, and at a high pressure. Initially, CMP will proceed at a very fast rate, as the peaks are being removed, then the rate will slow dramatically after the peaks have been substantially removed. The removal rate of the CMP is proportionally related to the pressure and the hardness of the surface being planarized.

Figure 5:
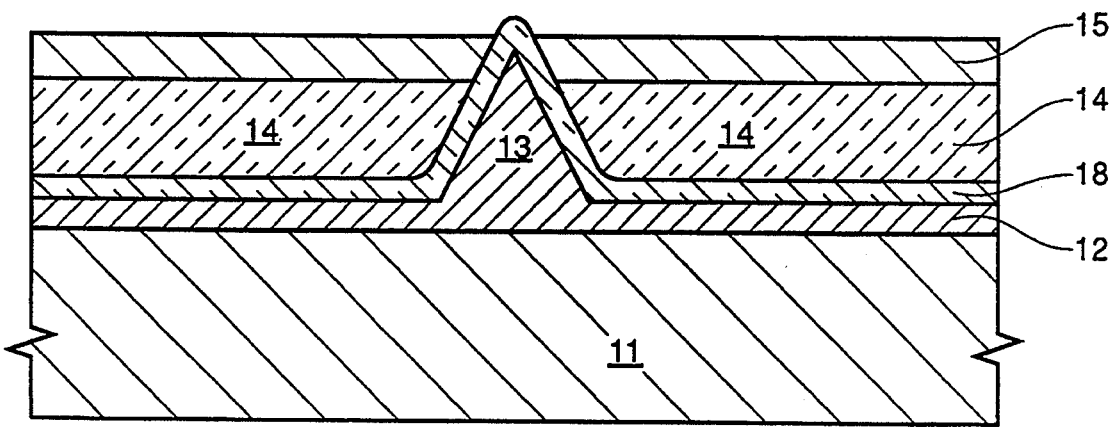
FIG. 5 shows the electron emitter tip of FIG. 4 after a chemical mechanical planarization (CMP) step has been performed, according to the present invention.

FIG. 5 illustrates the intermediate step in the gate formation process following the chemical mechanical planarization CMP. A substantially planar surface is achieved, and the conformal insulating layer 18 is thereby exposed. FIG. 5 shows the means by which the conformal insulating layer 18 defines the gate 15 to cathode 13 spacing, as well as the means by which the gate 15 becomes self-aligned.

Figure 6A:
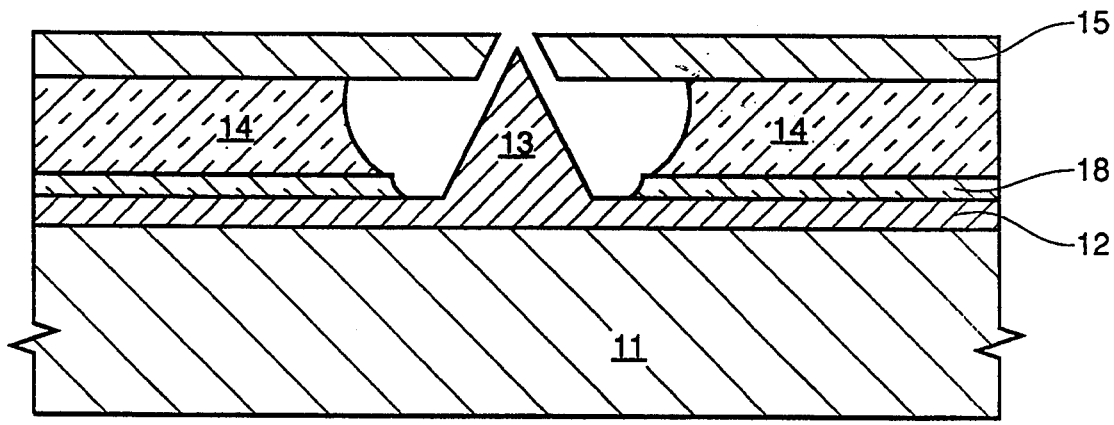
FIGS. 6A and 6B show the electron emitting tip of FIG. 5 after the insulating layer has undergone a wet etching process to expose the emitter tip, according to the present invention.
Figure 6B:
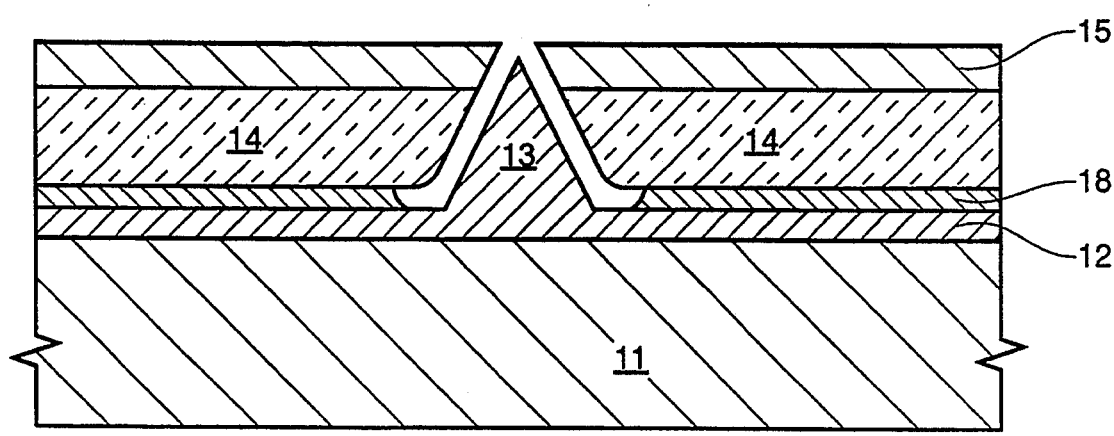

The next process step (FIG. 7) is a wet etching of the selectively-etchable material layer 18 to expose the emitter tip 13. The insulating layer 18 is selectively etchable with respect to the flowable material layer 14. FIGS. 6A and 6B illustrate the field emitter device after the insulating cavity has been so etched. FIG. 6A depicts the resultant structure when the insulating layer 18 is an oxide, and FIG. 6B depicts the resultant structure when the insulating layer 18 is a nitride.

If desired, the cathode tip 13 may, optionally, be coated with a low work-function material (FIG. 7). Low work function materials include, but are not limited to cermet ($Cr_3Si+SiO_2$), cesium, rubidium, tantalum nitride, barium, chromium silicide, titanium carbide, molybdenum, and niobium. Coating of the emitter tips may be accomplished in one of many ways. The low work-function material or its precursor may be deposited through sputtering or other suitable means on the tips 13. Certain metals (e.g., titanium or chromium) may be reacted with the silicon of the tips to form silicide during a rapid thermal processing (RTP) step. Following the RTP step, any unreacted metal is removed from the tip 13. In a nitrogen ambient, deposited tantalum may be converted during RTP to tantalum nitride, a material having a particularly low work function. The coating process variations are almost endless. This results in an emitter tip 13 that may not only be sharper than a plain silicon tip, but that also has greater resistance to erosion and a lower work function. The silicide is formed by the reaction of the refractory metal with the underlying polysilicon by an anneal step.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

I claim:

1. A process for the formation of self-aligned gate structures around an electron emitter, said process comprising the following steps:
   planarizing at least one electron emitter overlaid with oxide and polysilicon layers, wherein at least one of said layers comprises at least one of a conformal material and a non-conformal material, said planarizing involving chemical mechanical means; and
   selectively removing said oxide and said polysilicon layers, thereby exposing at least a portion of said electron emitter.

2. The process according to claim 1, wherein a buffer layer is disposed over said polysilicon layer, said buffer layer comprising silicon nitride.

3. The process according to claim 2, wherein said chemical mechanical means comprises a wetted polishing surface against which to rotate said overlaid electron emitter under controlled chemical slurry, pressure, and temperature conditions, said chemical slurry comprising at least one of alumina and silica, and a chemical etchant.

4. The process according to claim 1, wherein said oxide and said polysilicon layers are selectively removed by etching.

5. The process according to claim 4, wherein said electron emitter comprises a cold cathode, said cold cathode having a tip.

6. The process according to claim 5, further comprising the step of:
   sharpening said tip by oxidation.

7. The process according to claim 6, further comprising the step of:
   coating said tip with a silicide.

8. A process for the formation of a grid structure around an electron emitter, said process comprising the following steps:
   forming at least one cathode on a substrate;
   forming at least one insulating layer superjacent said cathode;
   depositing at least one conductive material layer superjacent said insulating layer;
   planarizing said layers by chemical mechanical planarization (CMP); and
   removing said layers to expose at least a portion of said cathode, wherein at least one of said layers comprises at least one of a conformal material and a non-conformal material.

9. The process according to claim 8, wherein said cathode is an electron emitter, said electron emitter having a tip.

10. The process according to claim 8, further comprising the step of:
    depositing a buffer material prior to subjecting the cathode to chemical mechanical planarization.

11. The process according to claim 8, wherein said insulating layer is grown through oxidation.

12. The process according to claim 8, wherein said removing further comprises the step of:
    etching said insulating layer thereby defining a gate structure.

13. The process according to claim 8, wherein said insulating layer is selectively etchable with respect to said conductive layer.

14. The process according to claim 8, wherein said substrate comprises at least one of polysilicon, doped polysilicon, and a silicide.

15. The process according to claim 8, wherein said insulating layer comprises at least one of silicon dioxide, silicon nitride, and silicon oxynitride.

16. A process for the formation of self-aligned gate structures around an electron emitting tip, said process comprising the following steps:
    forming at least one cathode on a substrate, said cathode having an emitter tip;
    forming a first layer superjacent said emitter tip;
    depositing a second layer superjacent said first layer, wherein at least one of said first and second layer comprise at least one of a conformal material and a non-conformal material;
    polishing said substrate by chemical mechanical means to expose at least a portion of said second layer, wherein said chemical mechanical means comprises an abrasive compound in a polishing slurry; and
    selectively removing said layers to expose the emitter tip, wherein said first layer is selectively removed by etching, said first layer being selectively etchable with respect to said second layer.

17. The process according to claim 16, wherein said first layer comprises an insulator and said second layer comprises a conductor.

18. The process according to claim 17, wherein said insulating layer comprises at least one of silicon dioxide, silicon nitride, and silicon oxynitride.

19. The process according to claim 18, wherein said emitter tip is disposed in an array of similar emitter tips.

20. The process according to claim 19, wherein said array is disposed in a flat panel display.

* * * * *